United States Patent [19]

McEwen

[11] Patent Number: 4,895,752
[45] Date of Patent: Jan. 23, 1990

[54] LOW DIELECTRIC CONSTANT LAMINATE OF FLUOROPOLYMER AND POLYARAMID

[75] Inventor: Craig S. McEwen, Wilmington, Del.

[73] Assignee: E. I. Du Pont de Nemours and Company, Wilmington, Del.

[21] Appl. No.: 363,350

[22] Filed: Jun. 6, 1989

Related U.S. Application Data

[63] Continuation of Ser. No. 134,712, Dec. 18, 1987, abandoned.

[51] Int. Cl.$^4$ .................... B32B 9/04; B32B 15/08
[52] U.S. Cl. .................................. 428/245; 428/246; 428/290; 428/422; 428/458; 428/463; 428/469; 428/901; 210/500.1
[58] Field of Search .............. 428/422, 461, 458, 245, 428/246, 290, 901, 469, 463; 210/500.1

[56] References Cited

U.S. PATENT DOCUMENTS

| 2,539,329 | 1/1951 | Sanders | 428/422 |
| 3,025,185 | 3/1962 | Schmidt | 428/245 |
| 3,136,680 | 6/1964 | Hochberg | 428/901 X |
| 4,337,155 | 6/1982 | Sasaki et al. | 210/500.1 |
| 4,513,055 | 4/1985 | Leibowitz | 428/245 |
| 4,725,504 | 2/1988 | Knudsen et al. | 428/458 |

FOREIGN PATENT DOCUMENTS 0178943 4/1986 European Pat. Off. ......... 428/901

Primary Examiner—Thomas J. Herbert
Attorney, Agent or Firm—Andrew G. Golian

[57] ABSTRACT

Laminate is disclosed comprising a perfluoropolymer reinforced with polyaramid positioned between two layers of copper.

9 Claims, No Drawings

LOW DIELECTRIC CONSTANT LAMINATE OF FLUOROPOLYMER AND POLYARAMID

This application is a continuation of Ser. No. 134,712, filed Dec. 18, 1987, now abandoned.

TECHNICAL FIELD

This invention relates to laminates comprising a layer of a perfluoropolymer reinforced with polyaramid positioned between two layers of copper.

BACKGROUND OF THE INVENTION

The use of polytetrafluoroethylene or copolymers of tetrafluoroethylene as a printed circuit board substrate material or dielectric material is well known. The advantage of polytetrafluoroethylene include high temperature stability, low moisture absorption, and outstanding chemical resistance even at elevated temperatures. Additionally, the dielectric constant varies remarkably little over a wide range of temperatures and frequencies. This means that the use of these fluoropolymers results in the reduction of signal propagation delay, the reduction of signal attenuation, reduced distances between signal and ground planes for a given impedance value, and the reduction of crosstalk between closely spaced conductor lines. Thus, polytetrafluoroethylene and copolymers of tetrafluorethylene are uniquely suited for high-speed digital and high frequency printed circuit boards. In addition, reduced crosstalk makes possible higher circuit densities.

However, polytetrafluoroethylene and copolymers of tetrafluoroethylene also possess a relatively high coefficient of thermal expansion. A significant level of reinforcement is required to restrain this expansion as well as to provide mechanical durability to the finished printed circuit board. Failure to restrain this expansion can result in stress relief when the copper is selectively etched away to define a circuit pattern, leading to undesirably large dimensional changes in the printed circuit board. An appropriate level of reinforcement is reflected in good dimensional stability, or minimum dimensional change after the copper has been removed by etching and the unclad laminate has been thermally cycled. In general, a dimensional stability value of one mil per inch or less is considered to be to be good. This means that the average expansion or contraction of the material is only one mil per inch or less.

Polytetrafluoroethylene laminates are commonly reinforced with glass fibers. They can have good dimensional stability, but also have relatively poor electrical properties because the dielectric constant of glass (6.3) is significantly higher than that of polytetrafluoroethylene (2.1). On the other hand, polytetrafluoroethylene laminates can be made with low glass levels to achieve good electrical properties at the cost of inadequate reinforcement and resultant poor dimensional stability.

It is also known to combine fluoropolymers with polyaramid fabrics and papers. Polyaramids are known to have high thermal stability and are usually combined with fluoropolymers to provide a composite that provides both chemical resistance and heat stability, as in Schmidt, U.S. Pat. No. 3,025,185, and Sasaki et al., U.S. Pat. No. 4,337,155. In some references the utility of such composites in printed circuit board applications is recognized. Hochberg, U.S. Pat. No. 3,136,680, discloses the use of polytetrafluoroethylene reinforced with glass, asbestos, metal or other heat-resistant woven or nonwoven fabric in printed circuit boards. Obviously, the dielectric properties of the composite would vary radically depending upon which of the above reinforcing materials was used. Leibowitz, U.S. Pat. No. 4,513,055, discloses a controlled thermal expansion composite for use in printed circuit boards which comprises a fabric composed of yarn with a positive coefficient of thermal expansion and yarn with a negative coefficient of thermal expansion, which may be polyaramid, embedded in a resin matrix which may be a fluoropolymer. The level of resin used is generally about 50% by weight. Tokarsky, European Patent Application 0 178 943, discloses a para-aramid paper for use in printed circuit boards. Among many binders which can be used with the paper, fluorocarbon resins may also used where their special properties, e.g., low dielectric constant, low dielectric loss, and low moisture regain, are desired. However, it is well known that neither polyaramid nor fluoropolymer materials adhere readily to copper which is the most frequently used conductive layer in printed circuit boards. In many cases an adhesive layer must be used.

It is therefore the object of the present invention to provide a laminate which has both good dimensional stability and good electrical properties, and which provides good adhesion to copper.

SUMMARY OF THE INVENTION

The present invention is directed to a laminate comprising in order (1) a layer of copper, (2) a layer of fluoropolymer selected from the group consisting of polytetrafluoroethylene, a copolymer of tetrafluoroethylene and hexafluoropropylene, a copolymer of tetrafluoroethylene and perfluoro (propyl vinyl ether), a terpolymer of tetrafluoroethylene, hexafluoropropylene, and perfluoro (propyl vinyl ether) and a terpolymer of tetrafluoroethylene, hexafluoropropylene, and perfluoro (ethyl vinyl ether) which is reinforced with a fabric of polyaramid fibers, such that the volume percent of polyaramid on the basis of polyariamid plus fluoropolymer is less than about 40, and (3) a second layer of copper.

DETAILED DESCRIPTION OF THE INVENTION

Disadvantages of the prior art printed circuit board materials are eliminated and a laminate with low dielectric constant, good dimensional stability, and excellent adhesion to copper is obtained with the present invention. It is particularly surprising that the adhesion to copper is so great when the adhesion of copper to the individual fluoropolymer and polyaramid components in comparison is very poor.

The fluoropolymers which are useful in practicing the invention are any perfluorinated polymers which can be provided in the form of a film or sheet or can be coated from an aqueous dispersion. Suitable fluoropolymers include polytetrafluoroethylene (PTFE); copolymers of tetrafluoroethylene and hexafluoropropylene (FEP) as described in U.S. Pat. No. 2,946,763; copolymers of tetrafluorethylene and perfluoro (propyl vinyl ether) (PFA) as described in U.S. Pat. No. 3,132,123; and terpolymers of tetrafluoroethylene, hexafluoropropylene and either perfluoro (propyl vinyl ether) or perfluoro (ethyl vinyl ether) as described in U.S. Pat. No. 4,029,868.

The polyaramids useful in the present invention are para-oriented aromatic polyamides as described in U.S. Patent No. 3,869,429, in which rigid radicals are linked into polymer chains by amide groups. The chain-extending bonds of the rigid radicals are either coaxial or parallel and oppositely directed. The rigid radicals may be single-ring radicals, multi-ring radicals in which the chain-extending bonds are para-oriented, fused ring radicals or heterocyclic radicals. Preferred rigid radicals are 1,4'-phenylene, 2,6-naphthalene, 1,5-naphthalene, 4,4'-biphenylene, trans-1,4-cyclohexylene, trans-trans-4,4'-bicyclohexylene, 1,4-pyridylene and 1,4-phenylene groups linked by trans-vinylene, ethynylene, azo or azoxy groups. The polyamides may be substituted with simple groups such as chloro- and methyl groups. Both homopolymers and copolymers are suitable as long as the rigid radicals are as defined above. Up to five mole percent of non-conforming radicals may be included.

The polyaramid is present in the form of a woven or nonwoven fabric made from continuous filaments. Preferably, the polyaramid is present in the form of a woven fabric. Most preferably the fabric is style 108, which is a plain weave, 55 denier balanced fabric with 60×60 weave (warp x fill); each strand is composed of 24 filaments.

The relative proportions of the polyaramid and fluoropolymer in the composite is critical to the balance of properties achieved. The dielectric constant is expected to decrease with decreasing amounts of polyaramid. However, the dimensional stability and adhesive properties are not as straightforward to predict. The dimensional stability depends on the relative coefficients of thermal expansion for all the components. The adhesion is poor with both polyaramid and fluoropolymer alone. Surprisingly, a laminate in which all three properties approach an optimum value can be achieved by limiting the amount of polyaramid in the composite material to less than about 40 percent by volume. Preferably the polyaramid content is in a range from 5 to 25 percent by volume. In determining the polyaramid content, the volume percent is affected by the presence of voids in the composite. In most conventional composites the void content will be in the range of 3-5% and the measurement will be affected only to that extent. Thus on the basis of about 5% void areas the true volume percent should be in the range of about 5+0.25 to 40+2.

The fluoropolymer/polyaramid composite is preferably made by coating the polyaramid fabric with an aqueous dispersion of the resin as described in Sanders, U.S. Pat. No. 2,539,329. The coated fabric is then dried and sintered above the melting point of the polymer. For Teflon® TFE, Teflon® PFA, and Teflon® FEP fluoropolymer the melting points are 635-650° F., 575-590° F., and 500-530° F., respectively. This coating process may be repeated more than once to prepare samples with higher weight and higher percentage fluoropolymer. Although the final fabric weight is not particularly critical, it is generally in the range of 3.3 to 30.3 ounces per square yard (1.1 to 10.3 grams per square decimeter). A preferred weight range is 5.4 to 30.3 ounces per square yard (1.8 to 10.3 grams per square decimeter).

The treated polyaramid fabric may be used alone or combined with sheets of fluoropolymer film to increase the level of fluoropolymer. The fluoropolymer film layers can be alternated with the treated polyaramid fabric layers in a symmetrical fashion. A three-ply structure is made up of fluoropolymer film/treated polyaramid fabric/fluoropolymer film. A five-ply structure is made up of fluoropolymer film/treated polyaramid fabric/fluoropolymer film/treated polyaramid fabric/fluoropolymer film. Further, two layers of fluoropolymer film or two layers of treated polyaramid fabric may be substituted for the single layers in the above structures.

The copper foil to be used can be prepared by any conventional processes, such as electrodeposition or roll-annealing. Electrodeposited copper foil is produced by plating onto a stainless steel drum, from which the copper foil is continuously stripped. The inner surface of the resulting foil exhibits a smooth finish, whereas the outer surface is coarse. Alternatively, rolled-annealed copper foil is produced by alternately cold-rolling and annealing cast copper ingots. One of the surfaces may be treated by electrodepositing copper to coarsen the surface to improve adhesion. Often the foil is treated to give a layer of copper oxide to further improve adhesion. With some fluoropolymers it may be desirable to improve the adhesion even further by treating the copper foil with a layer of zinc or brass as described in copending application U.S. Ser. No. 134,712 in which I am a joint inventor. The thickness of the copper foil is not particularly critical, however in printed circuit board applications thicknesses of about 0.0014 inch (0.0036 cm) to about 0.0028 inch (0.0071 cm) are generally used. This corresponds to a thickness by weight of 1 to 2 ounces per square foot (3 to 6 grams per square decimeter). Most copper foils are identified by their weight alone, e.g. 1-ounce copper foil.

To prepare the final laminate, one or more layers of the treated polyaramid fabric or one of the structures given above are then placed between two layers of copper such as a foil and laminated together at elevated temperature and pressure. The temperature should be above the melting point of the particular fluoropolymer film used, but should not exceed about 800° F. A preferred temperature range is 650 to 750° F. (370 to 400° C.) when the fluoropolymer is PTFE or PFA; 600 to 650° F. (315 to 345° C.) when the fluoropolymer is the lower melting FEP. The pressure is not critical but generally is above about 25 psi. A preferred pressure range is from 100 to 300 psi.

The application of temperature and pressure required for lamination may be carried out using a heated hydraulic press. Alternatively, the lamination can be carried out using a vacuum lamination technique. Either vacuum autoclave lamination (VAL) or vacuum hydraulic lamination (VHL) may be used. When VAL is used the structure to be laminated is placed on a carrier tray equipped with vacuum hookups. This forms the vacuum assembly. The most common VAL method used for applying a vacuum consists of placing a flexible membrane over the structure to be laminated, sealing at the edges and then drawing a vacuum. The vacuum assembly is transferred into a pressure vessel which is also sealed. The vessel is then pressurized with inert gas and heated to the desired lamination temperature. When VHL is used a similar vacuum assembly is used and then placed into the opening of a static hydraulic press. The thermal input is through the platens of the press.

The resultant copper-clad laminate is then processed to form a conductor pattern. Typically, a conductor pattern is formed by applying a photosensitive, etch-resistant coating to the copper, exposing those areas where the pattern is desired, developing by washing away the unexposed areas, and etching off the unnecessary copper.

In accordance with the teachings herein improved results are obtained employing a perfluoropolymer reinforced with polyaramid in the concentrations specified. Accordingly a layer which contacts the perfluoropolymer can vary such as copper, copper oxide, zinc, or brass as previously described or can be another material such as an adhesive, etc. However, it is critical that the reinforced perfluoropolymer is sandwiched between two copper layers.

EXAMPLES

The dimensional stability of the laminates was measured according to Test Method No. 2.4.39, Revision A of the Institute for Interconnecting and Packaging Electronic Circuits (IPC). Values are reported after a second, higher temperature bake (150° C.) according to the test procedure. The values thus represent the maximum dimensional change achievable with the test. The dielectric constant was measured at 1 MHz according to Test Method 2.5.5.3, Revision B of the IPC. The adhesion was measured using an Instron Testing Instrument (Instron Corp., Canton, MA) according to Test Method No. 2.4.9, Revision A, Method B of the IPC.

In the following examples all percentages are by volume unless otherwise indicated.

EXAMPLE 1

Style 108 Kevlar ® polyaramid fabric, 1 oz/yd², was coated to various weights with Teflon ® TFE 30B polytetrafluoroethylene resin dispersion (E. I. du Pont de Nemours and Company, Wilmington, DE), an aqueous dispersion with 60% by weight Teflon ® TFE fluoropolymer. The coated fabric was dried and sintered at 680° F. Repeated applications of the TFE dispersion were required to prepare heavier and higher percent TFE samples.

Two sheets of the coated fabric were cross-plied and positioned between two sheets of 1-ounce rolled-annealed oxide-treated copper foil. This layered structure was placed in a model MTP-14 press (Tetrahedron Associates, Inc., San Diego, CA). The temperature of the press was brought up to 680° F. at 25° F./minute, held there for 30 minutes, and then cooled to below 100° F. at 50° F./minute. A pressure of 100 psi was maintained throughout the cycle. A sheet of 5-mil Teflon ® TFE film (Dixon Industries Corp., Bristol, RI) with no Kevlar ® reinforcement was used as a control. Conditions were as above except that the pressure was 300 psi. The results are given in Table 1. All dimensional changes are positive except for the control.

TABLE 1

| % Fiber[a] | Dim. Stab.[b] | Diel. Const. | Adhesion[c] |
|---|---|---|---|
| 0 | 47.4 (−) | 2.05 | 1.0 |
| 26 | 1.2 (+) | 2.18 | 12.0 |
| 40 | 1.0 (+) | 2.45 | 10.2 |
| 50 | 1.9 (+) | 2.51 | 4.7 |
| 56 | 2.1 (+) | 2.54 | 3.1 |
| 66 | 2.6 (+) | 2.46 | 2.1 |

[a]Percent fiber is the volume percent of polyaramid on the basis of the total of polyaramid plus fluoropolymer.
[b]mils per inch
[c]pounds per linear inch

EXAMPLE 2

The procedure in Example 1 was repeated except that the aqueous Teflon ® TFE dispersion was replaced by Teflon ® 335J PFA resin dispersion (E. I. du Pont de Nemours and Company, Wilmington, DE), an aqueous dispersion with 60% by weight Teflon ® PFA. The coated fabric was dried and sintered at 630° F.. The peak lamination temperature was 650° F. and the pressure was 300 psi. A sheet of 5-mil Teflon ® PFA film (E. I. du Pont de Nemours and Company, Wilmington, DE) was used as a zero-reinforcement control. The results are given in Table 2. As before, all dimensional changes are positive except for the zero-reinforcement control.

TABLE 2

| % Fiber[a] | Dim. Stab.[b] | Diel. Const. | Adhesion[c] |
|---|---|---|---|
| 0 | 45.6 (−) | 2.05 | 1.5 |
| 25 | 0.7 (+) | 2.12 | 12.9 |
| 38 | 1.4 (+) | 2.30 | 10.7 |
| 54 | 1.2 (+) | 2.50 | 7.3 |
| 58 | 1.4 (+) | 2.65 | 6.5 |
| 67 | 1.7 (+) | 2.40 | 5.0 |

EXAMPLE 3

The Teflon ® TFE-coated Kevlar ® fabric described in Example 1 was combined with sheets of Teflon ® TFE film by stacking the fabric and film in alternating fashion to form a symmetrical 5-ply structure, i.e. film/fabric/film/fabric/film. The thickness of the Teflon ® TFE film was chosen to give the correct Teflon ®/Kevlar ® content. Two sheets of thin film were sometimes used in place of a thicker film. Laminating conditions were the same as in Example 1 except that the pressure was 300 psi. The results are given in Table 3. Several samples exhibited a positive dimensional change in one direction and a negative dimensional change in the other. The dimensional stability was determined by averaging the absolute value of the dimensional changes. These samples are marked "+,−".

TABLE 3

| % Fiber[a] | Dim. Stab.[b] | Diel. Const. | Adhesion[c] |
|---|---|---|---|
| 0 | 47.4 (−) | 2.05 | 1.0 |
| 10 | 0.8 (+,−) | 1.87 | 12.2 |
| 15 | 0.9 (+,−) | 1.80 | — |
| 20 | 1.0 (+) | 2.02 | — |

EXAMPLE 4

The procedure described in Example 3 was repeated except that the Teflon ® TFE-coated-Kevlar ® fabric and Teflon ® TFE film were replaced by the Teflon ® PFA-coated Kevlar ® fabric described in Example 2 and Teflon ® PFA film. The laminating conditions were the same as in Example 2. The results are given in Table 4.

TABLE 4

| % Fiber[a] | Dim. Stab.[b] | Diel. Const. | Adhesion[c] |
|---|---|---|---|
| 0 | 45.6 (−) | 2.05 | 1.5 |
| 10 | 0.3 (+,−) | 1.89 | 14.7 |
| 15 | 0.1 (+) | 1.97 | — |
| 20 | 1.0 (+) | 2.03 | — |

What is claimed is:
1. A laminate comprising in order (1) a layer of copper, (2) a layer of fluoropolymer selected from the group consisting of polytetrafluoroethylene, a copolymer of tetrafluoroethylene and hexafluoropropylene, a copolymer of tetrafluoroethylene and perfluoro (propyl vinyl ether), a terpolymer of tetrafluoroethylene, hexafluoropropylene, and perfluoro (propyl vinyl ether) and a terpolymer of tetrafluoroethylene, hexafluoropropylene, and perfluoro (ethyl vinyl ether) which is reinforced with a woven or nonwoven fabric of polyaramid fiber, such that the volume percent of polyaramid on the basis of the total of the polyaramid plus fluoropolymer is less than about 40, and (3) a second layer of copper with the proviso:

(a) a layer of copper oxide, zinc or brass is intermediate and contacts both layers (1) and (2), or (b) a layer of copper oxide contacts layer (1) and a layer of zinc or brass is intermediate and contacts both the layer of copper oxide and layer (2) or (c) layer (1) contacts layer (2) and with the further proviso:

(d) a layer of copper oxide, zinc or brass is intermediate and contacts both layers (2) and (3), or (e) a layer of copper oxide contacts layer (3) and a layer of zinc or brass is intermediate and contacts both the layer of copper oxide and layer (2), or (f) layer (2) contacts layer (3).

2. The laminate of claim 1 wherein the fluoropolymer is polytetrafluorethylene and the volume percent of polyaramid is in a range from 5 to 25.

3. The laminate of claim 1 wherein the fluoropolymer is a copolymer of tetrafluorethylene and perfluoro (propyl vinyl ether) and the volume percent of polyaramid is in a range from 5 to 25.

4. The laminate of claim 1 wherein the fluoropolymer is a copolymer of tetrafluorethylene and hexafluoropropylene and the volume percent of polaramid is in a range from 5 to 25.

5. The laminate of claim 1 wherein a layer of copper oxide is present between each of the copper layers (1) and (3) and the polyaramid-reinforced fluoropolymer layer (2).

6. The laminate of claim 1 wherein in a layer of zinc or brass is present between each of the copper layers (1) and (3) and the polyaramid-reinforced fluoropolymer layer (2).

7. The laminate of claim 1 wherein the polyaramid is poly(p-phenylene terephthalamide).

8. The laminate of claim 1 wherein the polyaramid-reinforced fluoropolymer layer (2) comprises a polyaramid fabric impregnated with fluoropolymer resin.

9. The laminate of claim 1 wherein the polyaramid-reinforced fluoropolymer layer (2) comprises a polyaramid fabric impregnated with fluoropolymer resin and at least one sheet of fluoropolymer film.

* * * * *